(12) United States Patent
Huang

(10) Patent No.: US 6,713,864 B1
(45) Date of Patent: Mar. 30, 2004

(54) SEMICONDUCTOR PACKAGE FOR ENHANCING HEAT DISSIPATION

(75) Inventor: Chien-Ping Huang, Hsinchu Hsien (TW)

(73) Assignee: Siliconware Precision Industries Co., Ltd., Tantzu (TW)

( * ) Notice: Subject to any disclaimer, the term of this patent is extended or adjusted under 35 U.S.C. 154(b) by 0 days.

(21) Appl. No.: 09/665,818

(22) Filed: Sep. 20, 2000

(30) Foreign Application Priority Data

Aug. 4, 2000 (TW) ........................................ 89115701 A

(51) Int. Cl.⁷ .............................................. H01L 23/34
(52) U.S. Cl. ........................................ 257/712; 257/692
(58) Field of Search ................................ 257/704, 705, 257/706, 707, 710, 778, 779, 780

(56) References Cited

U.S. PATENT DOCUMENTS

| 5,294,750 A | * | 3/1994 | Sakai et al. ................. 174/52.4 |
| 5,789,820 A | * | 8/1998 | Yamashita .................. 257/787 |
| 6,081,029 A | * | 6/2000 | Yamaguhci .................. 257/718 |
| 6,159,764 A | * | 12/2000 | Kinsman et al. ............ 438/106 |
| 6,329,228 B1 | * | 12/2001 | Terashima .................. 438/156 |

FOREIGN PATENT DOCUMENTS

JP 09-172126 * 6/1997 ........... H01L/23/50

* cited by examiner

*Primary Examiner*—Long Pham
*Assistant Examiner*—Dana Farahani
(74) *Attorney, Agent, or Firm*—Ladas & Parry

(57) ABSTRACT

The present invention discloses a semiconductor package for enhancing heat dissipation. Only the structures of the semiconductor package that conventionally located in one of the two parts of the mold conventionally used to encapsulate a semiconductor package are encapsulated. A heat sink of the desired thickness is then attached to leads in the plurality of leads connected to the encapsulated die and possibly also to the die pad or leadframe with a thermally conductive and electrically insulating adhesive glue. As the thickness of the heat sink can be freely varied according to user's needs, the present invention is advantageous for manufacturing thin packages. Since the width of the heat sink covers the die pad and a part of the plurality of leads, the heat generated by the die is not only dissipated to the atmosphere from the heat sink connected to the leads of the leadframe to the air, but also dissipated through the printed circuit board connected to the leads of the leadframe to the air.

19 Claims, 5 Drawing Sheets

SEMICONDUCTOR PACKAGE FOR ENHANCING HEAT DISSIPATION

BACKGROUND OF THE INVENTION

1. Field of the Invention

The present invention relates to a heat-dissipation-enhanced semiconductor package. More particularly, the present invention is directed to a heat-dissipation-enhanced semiconductor package for reducing the probability of delamination occurring, and the number of steps in the manufacturing process.

2. Description of the Related Art

For a semiconductor package, the problem of heat dissipation is a very important issue. A semiconductor package with bad heat dissipation may not just produce errors, but may also reduce product reliability and greatly increase manufacturing cost.

FIG. 1 shows the DHS (Drop-in Heat Sink) structure of a semiconductor package disclosed in U.S. Pat. No. 5,225,710. The package's structure comprises: a die a pad 14; a die 12, which is attached to a first surface 141 of the die pad 14 with a suitable adhesive 15, such as a silver paste; a plurality of leads 13 electrically connected to an active surface 121 of the die 12 by a plurality of bonding wires 17, such as gold wires; a heat sink 16 and an encapsulant 11. The die pad 14 and the plurality of leads 13 are all a part of a leadframe and are placed inside an upper mold 18 during manufacture. The heat sink 16 is located inside a lower mold 19, and one surface of the heat sink 16 contacts the bottom of the lower mold 19 with points 161 and 162. Another surface of the heat sink is attached to the second surface 142 and the die pad 14.

An encapsulant 11 is injected to fill the molding cavity left by the package structure when the upper mold 18 and lower mold 19 are closed. The heat generated by the die 12 in the DHS package is characteristically dissipated from the die pad 14, through the heat sink 16 attached to the die pad 14 and then to the atmosphere.

FIG. 2 shows the EDHS (Exposed Drop-in Heat Sink) structure of a semiconductor package disclosed in U.S. Pat. No. 5,381,042. The difference between the EDHS structure and the DHS structure is that in the EDHS structure a heat sink 21 with a flat bottom is directly exposed to the bottom of the semiconductor package, unlike the heat sink 16 of the DHS structure, which contacts the bottom of the semiconductor package through the points 161 and 162. The exposed surface drop-in heat sink 21 provides a larger contact area than the drop-in heat sink 16 to dissipate heat. Therefore, heat dissipation in the EDHS structure is more effective than that in the DHS structure. However both the DHS and the EDHS structures have the following disadvantages:

1. During the DHS 16 and EDHS 21 manufacturing processes, the heat sink is put inside the lower mold 19 first, and the die pad 14 then aligned to the heat sink. In other words, an extra step is added, which increases the cycle time of the manufacturing process, and thus reduces the throughput.

2. The DHS 16 and EDHS 21 packages are covered by the encapsulant 11, but both heat sinks have a CTE (Coefficient of Thermal Expansion) that is different from that of the encapsulants. Therefore, when temperature changes cause expansion and shrinking, the effect of this thermal stress on the contact surface between the heat sink and the encapsulant will cause delamination of that contact surface. Moreover, in both examples, because the amounts of encapsulant 11 inside the upper mold 18 and lower mold 19 are not the same, the package structure will also be warped after it cools, due to the different amounts of shrinking produced by the different amounts of encapsulant. Moisture in the atmosphere can enter the package through cracks caused by either delamination or warping; therefore, the reliability of the delaminated or warped semiconductor package is reduced.

3. When the encapsulant 11 is injected into the closed mold, the heat sink 21 is attached by four tie bars on the diagonals of the leadframe (not shown). As the strength of the four tie bars is not necessarily great enough to hold the heat sink 21 in place, some flashed encapsulant will be left on the bottom of the semiconductor package after encapsulation. The manufacturing cost of these packages is also increased by the additional deflashing step required to correct that.

4. In use, the known semiconductor packages described above provide heat dissipation paths which extend from the die 12, through the die pad 14, to the heat sinks 16 or 21, and finally to the atmosphere. These heat dissipation paths are too limited because the plurality of leads are not used for dissipating the heat, reducing the efficiency of their heat dissipation.

5. Finally, thin products such as some consumer ICs, where the thickness of the package ("P" in FIGS. 1 and 2) is less than 1.00 mm, the thickness of the space in the lower mold is less than 0.45 mm, as shown in FIGS. 1 and 2. Therefore, the heat sinks 16 or 21 shown in FIGS. 1 and 2 cannot be put inside such a thin package.

SUMMARY OF THE INVENTION

The present invention provides a semiconductor package which eliminates the need to put a heat sink inside the lower mold before the package is encapsulated. A semiconductor package constructed in accordance with the present invention reduces the delamination caused by a difference in the CTE's of the encapsulant and the heat sink. The invention eliminates the need for a deflashing process and permits a plurality of leads to be used for dissipating the heat generated by the die. The invention provides a semiconductor package that is suitable for a thin product, such as a TQFP (Thin Quad Flat Package) or a TSOP (Thin Small Outline Package).

In a particular embodiment of a semiconductor package in accordance with the present invention, only the contents of the upper mold is encapsulated. The heat sink is attached to the die pad and to a part of the plurality of leads with a thermally conductive and electrically insulating adhesive glue.

In accordance with the invention, the thickness of the heat sink is adjustable to suit the user's demands. In particular, in accordance with the invention, the heat sink is not limited by the thickness specification of the lower mold in and, therefore, the present invention is more advantageous for manufacturing thin products.

Since the width of the heat sink covers both the die pad and a part of the plurality of leads, the heat generated by the die can be dissipated not only to the atmosphere but also through the heat and the leads sink to the printed circuit board attached to the leads. Furthermore, because of the width of the heat sink, there is no need for precise alignment between the die pad and the heat sink. There is also no need for the tie bars of the leadframe to exert pressure on the heat sink, and therefore the cycle time of the manufacturing process is reduced and throughput is increased.

Moreover, because the heat sink according to the present invention is not encapsulated inside the lower mold, but attached to some of the leads with an adhesive glue instead, even though the CTEs of the heat sink and encapsulant or the leadframe and encapsulant are not the same, the encapsulant will not be cracked or delaminated when structural expansion and shrinking occurs. Thus, the reliability of products using the semiconductor package is increased.

Finally, because the heat sink is not encapsulated, unsightly flash left when encapsulating the upper mold will be hidden when the heat sink is attached to the die pad in accordance with the present invention. This eliminates the need for a deflashing step in the manufacturing process.

A first embodiment of the semiconductor package for enhancing heat dissipation in accordance with the present invention comprises a die, a leadframe, an encapsulant and a heat sink. The leadframe includes a die pad having a first surface that the die is attached to and a plurality of leads electrically connected to an active surface of the die. The encapsulant is used to seal said die and leadframe. The heat sink is attached to the second surface of the die pad, and at least a portion of a surface of leads in the plurality of leads, with a thermally conductive and electrically insulating adhesive glue.

In a second embodiment of the semiconductor package for enhancing heat dissipation according to the present invention, the die includes an active surface and a second surface, and the leadframe includes a central-hole die pad and a plurality of leads. The central-hole die pad has a first surface that the die is attached to and a second surface. The plurality of leads are electrically connected to the active surface of the die. The heat sink is a T-type structure attached to the second surface of the die, to the second surface of the die pad and to at least a portion of a surface of leads in the plurality of leads with a thermally conductive and electrically insulating adhesive glue.

In a third embodiment of the semiconductor package for enhancing heat dissipation according to the present invention, the die includes an active surface. The leadframe includes a plurality of leads electrically connected to an active surface of the die. The heat sink is attached to at least a portion of a surface of leads in the plurality of leads with a thermally conductive and electrically insulating adhesive glue.

A manufacturing method for the first embodiment comprises at least the steps of: (a) attaching the die to a first surface of the die pad, so that an active surface of the die is electrically connected to the plurality of leads; (b) adding encapsulant to an upper mold for sealing the die and leadframe; (c) attaching the heat sink to the second surface of the die pad and to at least a portion of the surface of leads in the plurality of leads with the thermally conductive and electrically insulating adhesive glue; and (d) forming and singulating the leadframe.

A manufacturing method for the second embodiment at least comprises the steps of: (a) attaching the die to a first surface of the die pad so that an active surface of the die is electrically connected to a plurality of leads; (b) adding encapsulant to an upper mold for sealing the die, a and leadframe; (c) attaching the heat sink to a second surface of the die, a second surface of the die pad and at least a portion of the surface of leads in a plurality of leads with a thermally conductive and electrically insulating adhesive glue, and (d) forming and singulating the leadframe.

A manufacturing method for the third embodiment semiconductor package for enhancing heat dissipation according to the invention comprises at least the steps of: (a) electrically connecting an active surface of a die to the plurality of leads; (b) adding encapsulant to an upper mold for sealing said die and a first portion of a surface on the leads; and (c) attaching the heat sink to a second portion of the surface of the leads in the plurality of leads with the thermally conductive and electrically insulating adhesive glue.

BRIEF DESCRIPTION OF THE DRAWINGS

The invention is described below with reference to the appended drawings, in which:

FIGS. 3(a) to 3(d) show semiconductor products in various stages of a manufacture in accordance with the present invention;

DETAILED DESCRIPTION OF PREFERRED EMBODIMENTS

Figure 1:
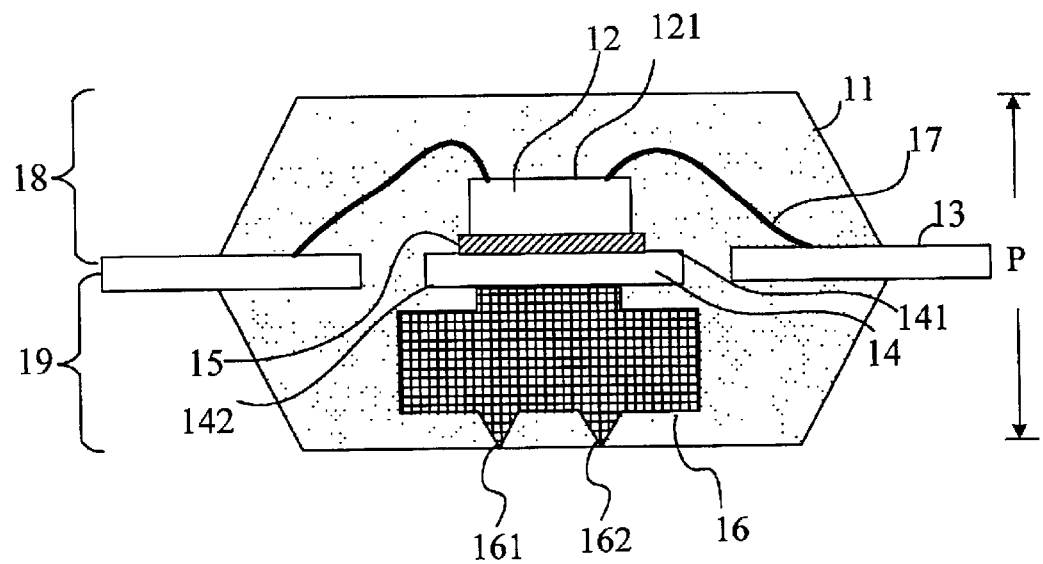
FIG. 1 shows a prior art DHS semiconductor package.
Figure 2:
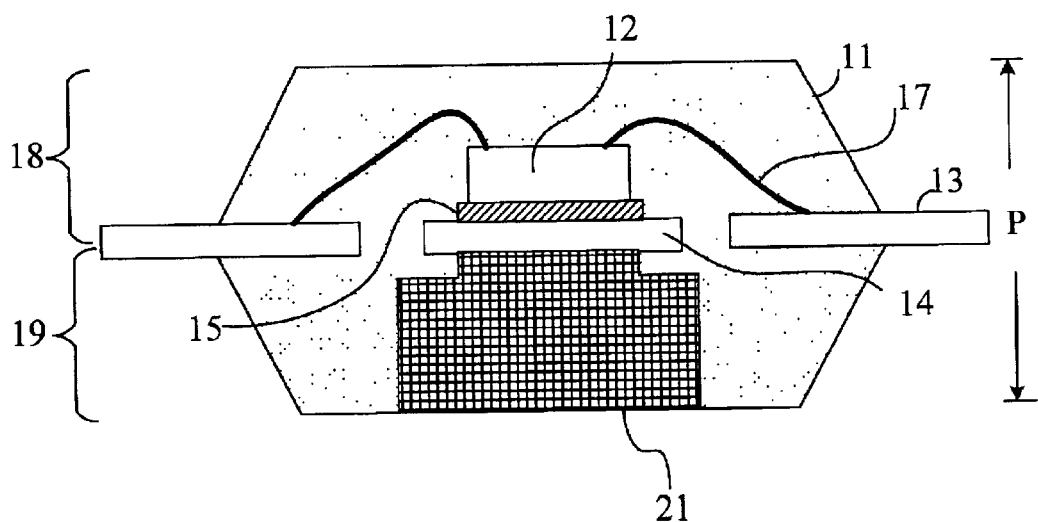
FIG. 2 shows a prior art EDHS semiconductor package.
Figure 3C:
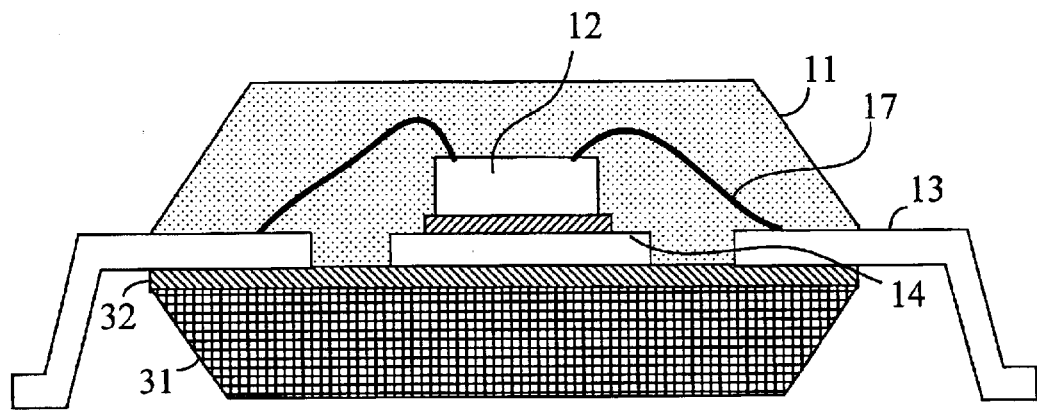
Figure 3D:
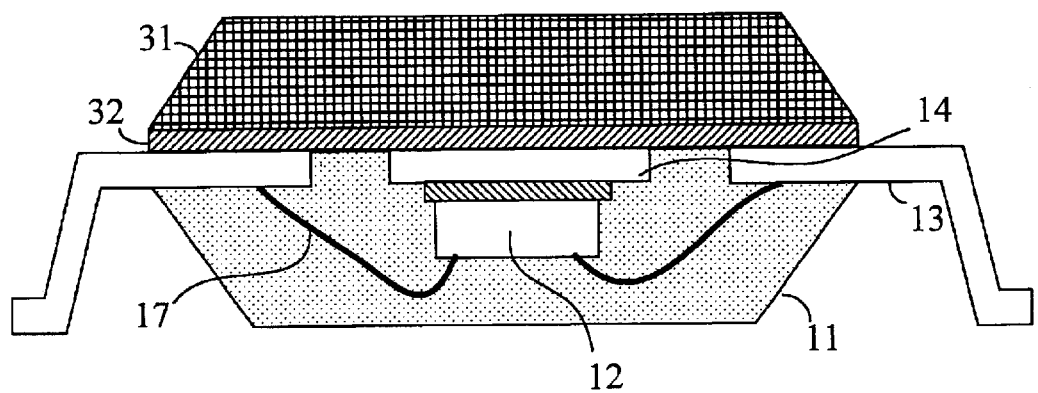
Figure 3C:
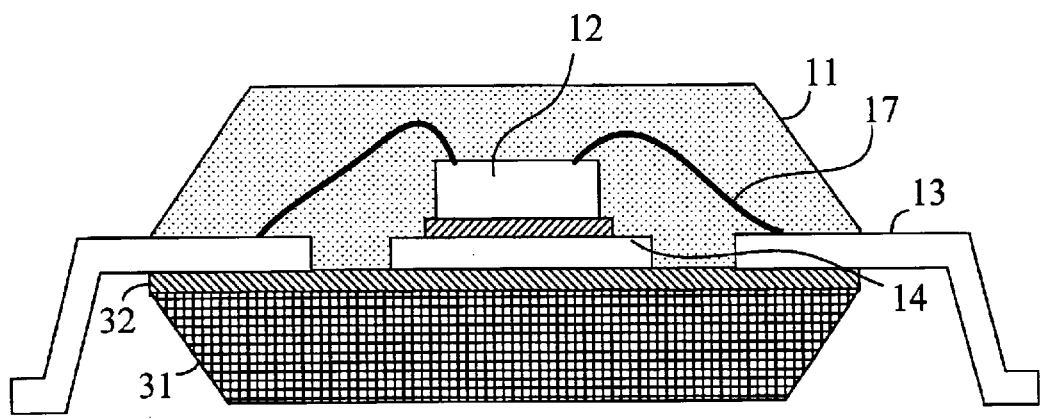
Figure 3D:
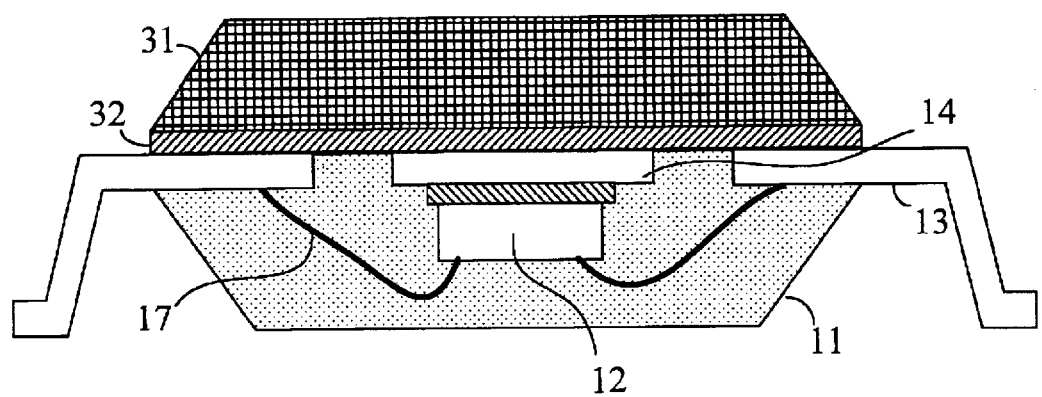

FIGS. 3(a) to 3(d) show semiconductor products manufactured in accordance with the present invention. In FIG. 3(a), a die 12 is attached to a first surface 141 of the die pad 14, and then wire bonding is provided between the active surface 121 of the die 12 and a plurality of leads 13. Afterwards, only the upper mold 18 is encapsulated.

In FIG. 3(b), after the encapsulation of the upper mold 18, as shown in FIG. 3(a), a heat sink 31 is attached to the second surface 142 of the die pad 14 and to a portion of the surface of a part of the plurality of leads 13 with adhesive glue 32. The thickness of the heat sink 31 can be a thickness that is suitable for the thin product. Therefore, the limitation in prior art that the thickness of the heat sink should be less than that of the lower mold does not apply to products manufactured in accordance with the present invention.

The adhesive glue 32 should be a thermally conductive but not electrically conductive one, such as well-known epoxy, B-stage epoxy or silicone adhesives, and the present invention is not limited to these materials. If a well-known B-stage epoxy, which is half-dry at about 50° C., is used as the adhesive glue, the heat sink 31 will be firmly attached to the die pad 14, the encapsulant 11 and a part of the plurality of leads 13 due to high pressures and high temperatures in the manufacturing process, as is well-known in the art. The material of the heat sink 31 could be made of the well-known copper, copper alloy materials, aluminum or aluminum alloy, and the present invention is not limited to these materials.

In FIG. 3(c), after the heat sink 31 is attached to the die pad and to leads that were partially encapsulated in the upper mold 18, a forming step bends the plurality of leads 13 towards the heat sink 31, and a singulating step cuts off the four tie bars (not shown) on the leadframe. However, in FIG. 3(c) the plurality of leads are bent towards the heat sink 31 in the forming step, so as to form a so-called "cavity-up" type of package. In contrast to FIG. 3(c), in FIG. 3(d) the plurality of leads are bent toward the upper mold 18 in forming step, so as to form a "cavity-down" type of package.

Figure 4:
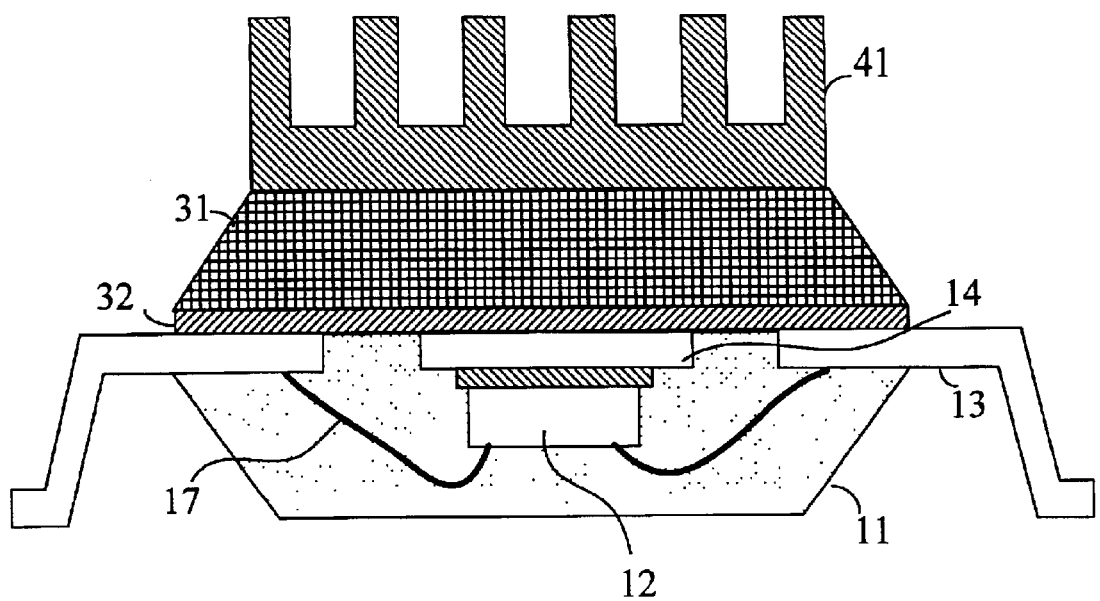
FIG. 4 shows a cavity-down package structure in accordance with the present invention.

FIG. 4 shows an embodiment of a cavity-down package structure according to the present invention. In FIG. 4, the top of the heat sink 31 has an additional heat radiator 41 for dissipating the heat generated by the die 12 to the atmosphere by convection and radiation.

Figure 5:
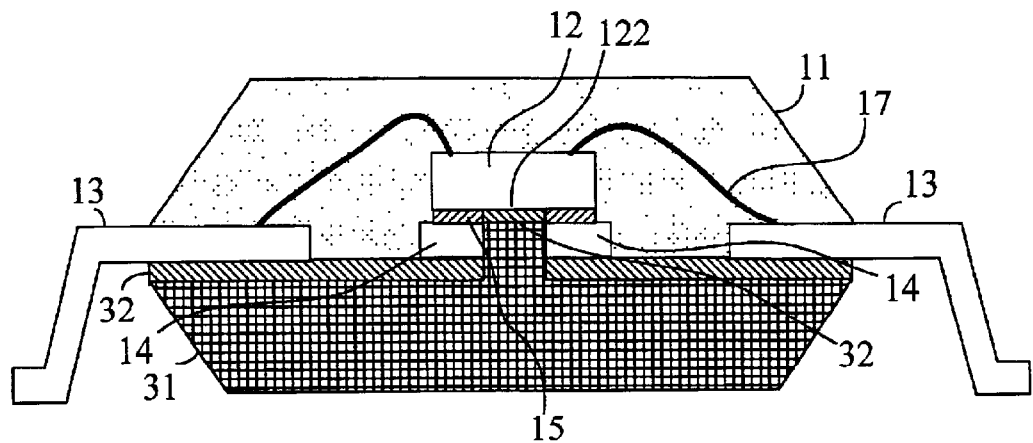
FIG. 5 shows a first cavity-up package structure in accordance with present invention.

FIG. 5 shows a further embodiment of a package structure according to the present invention. Unlike FIG. 4, in FIG. 5 the die pad 14 is a central-hole type of die pad, that is, the die pad 14 is split into two parts leaving a central hole. The advantage of this design is that it reduces the probability of delamination between the die 12 and the die pad 14. Thus, the heat sink 31 may be a T-shaped structure. After the encapsulation of the upper mold 18, the heat sink 31 is attached to the second surface 122 of the die 12, the die pad 14 and the leads 13. After that, the manufacturing process is finished by the forming step and the singulating step.

Figure 6:
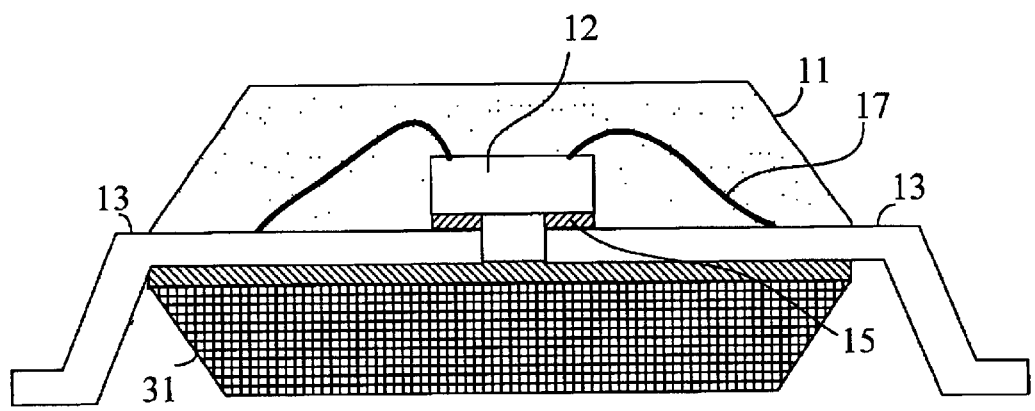
FIG. 6 shows a second cavity-up package structure in accordance with the present invention.

FIG. 6 shows another embodiment of a package structure according to the present invention. Unlike the other two embodiments, this package structure does not have a die pad. Instead, the die 12 is adhered to a portion of the surface of the leads 13 with die adhesive 15, as shown. The design is suitable for a die of any size. As shown in FIGS. 3(*b*) and 3(*c*), after the encapsulation in the upper mold of a portion of the surface of the leads, the heat sink 31 is attached to another portion of the surface of the leads by the adhesive glue 32, and the manufacturing process is finished by the forming and singulating steps described above.

Since the heat sink 31 constructed according to the invention is not inside the encapsulation material, even if the CTEs of the heat sink 31 and the encapsulant are not the same, delamination will to not occur because the adhesive glue serves as a buffering layer. Therefore, cracks due to thermal stress are not created, and the reliability of the package according to the present invention is improved. Furthermore, when encapsulation occurs only in the upper mold, there is no need to provide a deflashing step. No flash can be deposited on the heat sink because it isn't present during the encapsulation step in accordance with the invention. Although the bottom of the upper mold 18 may produce flash, after the heat sink 31 is attached to the encapsulated portion of the package with the adhesive glue 32 that flash is covered, and the appearance and function of the semiconductor package according to the present invention are not affected by that flash. In addition, because the die 12 and leads in the plurality of leads 13 are attached to the heat sink 31 with a thermally conductive adhesive glue 32, an additional heat dissipation path is provided from the die 12 through the die pad 14, the heat sink 31, and the leads 13, to the printed circuit board (not shown) on which the package is attached, in addition to the prior art path from the die 12 through the die pad 14 and the heat sink 31, to the atmosphere.

The above-described embodiments of the present invention are provided for the purpose of illustration, only. The present invention is well-suited for producing semiconductor packages of the TQFP and TSOP, types but it is not limited to those types of packages. Numerous alternative embodiments may be devised by those skilled in the art without departing from the spirit and scope of the invention, which is defined by the claims.

What is claimed is:

1. A semiconductor package for enhancing heat dissipation, comprising:
   a die having an active surface;
   a leadframe, including:
      a die pad having a first surface and a second surface, said die being attached to said first surface of the die pad; and
      a plurality of leads electrically connected to the active surface of said die and separated from said die pad, said leads having a first surface and a second surface opposite the first surface;
   an encapsulant sealing said die and at least a portion of the first surface of the leads in said leadframe but not sealing the second surface of the leads; and
   a heat sink attached to the second surface of said die pad and at least a portion of the second surface of leads in said plurality of leads with a thermally conductive and electrically insulating adhesive glue, said heat sink being constructed as a body whose entire outer surface is exposed to ambient atmosphere and no portion of said heat sink is in contact with said encapsulant.

2. The semiconductor package of claim 1, wherein said heat sink is made of material selected from the group consisting of copper, copper alloy, aluminum or aluminum alloy.

3. The semiconductor package of claim 1, wherein said adhesive glue is selected from the group consisting of epoxy, B-stage epoxy or silicone.

4. The semiconductor package of claim 1, wherein said leadframe is of a cavity-up or cavity-down type of leadframe.

5. The semiconductor package of claim 4, wherein said heat sink further comprises a heat radiator on its top and said leadframe is a cavity-down type of leadframe.

6. A semiconductor package of claim 1, manufactured by the steps of:
   (a) attaching said die to the first surface of said die pad and electrically connecting the active surface of said die to the plurality of leads;
   (b) adding encapsulant to an upper mold for sealing said die and one portion of the first surface of said plurality of leads;
   (c) attaching said heat sink to the second surface of said die pad and at least one portion of the second surface of leads in said plurality of leads with the thermally conductive and electrically insulating adhesive glue and with the thermally conductive and electrically insulating adhesive glue and
   (d) forming and singulating said leadframe.

7. The semiconductor package of claim 6, wherein in step (d), said leadframe is a cavity-up or cavity-down type of leadframe.

8. A semiconductor package for enhancing heat dissipation, comprising:
   a die having an active surface;
   a leadframe, including:
      a central-hole die pad having a first surface and a second surface, said first surface being attached to said die; and
      a plurality of leads electrically connected to the active surface of said die and separated from said die pad, said leads having a first surface and a second surface opposite the first surface;
   an encapsulant sealing one portion of the first surface of said plurality of leads and said die in said leadframe but not sealing the second surface of the leads; and
   a heat sink having a T-type structure including a portion extending in a hole of said die pad and attached to said second surface of said die by a thermally conductive and electrically insulating adhesive glue, said heat sink also being attached to the second surface of said die pad and at least a portion of the second surface of leads in said plurality of leads with said thermally conductive and electrically insulating adhesive glue, said heat sink being constructed as a body whose entire outer surface is exposed to ambient atmosphere and no portion of said heat sink is in contact with said encapsulant.

9. The semiconductor package of claim 8, wherein said heat sink is made of a material selected from the group consisting of copper, copper alloy, aluminum or aluminum alloy.

10. The semiconductor package of claim 8, wherein said adhesive glue is made of material selected from the group consisting of epoxy, B-stage epoxy or silicone.

11. The semiconductor package of claim 8, wherein said leadframe is of a cavity-up or cavity-down type of leadframe.

12. The semiconductor package of claim 11, wherein the top of said heat sink further comprises a heat radiator and said leadframe is a cavity-down type of leadframe.

13. The semiconductor package of claim 8, manufactured by the steps of:
  (a) attaching said die to the first surface of said die pad and electrically connecting the active surface of said die to the plurality of leads;
  (b) adding encapsulant to an upper mold for sealing said die and one portion of the first surface of said plurality of leads;
  (c) attaching said heat sink to the second surface of said die pad and at least one portion of the second surface of leads in said plurality of leads with said thermally conductive and electrically insulating adhesive glue; and
  (d) forming and singulating said leadframe.

14. The semiconductor package of claim 13, wherein in step (d), said leadframe is of a cavity-up or cavity-down type leadframe.

15. A semiconductor package for enhancing heat dissipation, comprising:
  a die having an active surface;
  a plurality of leads electrically connected to the active surface of said die, said leads having a first surface and a second surface opposite the first surface;
  an encapsulant sealing said die and at least a portion of the first surface of said leads but not sealing the second surface of the leads; and
  a heat sink attached to at least a portion of the second surface of leads in said plurality of leads with a thermally conductive and electrically insulating adhesive glue, said heat sink being constructed as a body whose entire outer surface is exposed to ambient atmosphere and no portion of said heat sink is in contact with said encapsulant.

16. The semiconductor package of claim 15, wherein said heat sink is made of a material selected from the group consisting of copper, copper alloy, aluminum or aluminum alloy.

17. The semiconductor package of claim 15, wherein said adhesive glue is made of selected from the group consisting of epoxy, B-stage epoxy or silicon.

18. The semiconductor package of claim 15, wherein said leads are a part of a leadframe of a cavity-up or cavity-down type.

19. The semiconductor package of claim 18, wherein the top of said heat sink further comprises a heat radiator and said plurality of leads is a part of a cavity-down type of leadframe.

* * * * *